United States Patent

Leyten et al.

[15] 3,657,565

[45] Apr. 18, 1972

[54] CONTROL CIRCUIT FOR POWER CONTROL BY MEANS OF A THYRISTOR

[72] Inventors: Johannes Leyten, Woudenberg; Nicolaas Mur, Amersfoort, both of Netherlands

[73] Assignee: Electrofact N.V., Amersfoort, Netherlands

[22] Filed: Aug. 25, 1970

[21] Appl. No.: 66,669

[30] Foreign Application Priority Data

Aug. 27, 1969 Netherlands..........................6913129

[52] U.S. Cl. ....................307/252 B, 307/247, 307/252 UA, 307/273, 307/305

[51] Int. Cl. ........................................................H03k 17/00

[58] Field of Search ...............307/273, 252.21, 252.74, 247, 307/305

[56] References Cited

UNITED STATES PATENTS

| | | | |
|---|---|---|---|
| 3,405,284 | 10/1968 | Chowdhuri | 307/273 |
| 3,396,310 | 8/1968 | Logan | 307/273 |
| 3,222,577 | 12/1965 | Kennedy | 307/273 |
| 3,381,226 | 4/1968 | Jones | 307/252 U |
| 3,450,891 | 6/1969 | Riley | 307/252 U |
| 3,386,498 | 6/1968 | Funfstuck | 307/273 |

*Primary Examiner*—Donald D. Forrer
*Assistant Examiner*—David M. Carter
*Attorney*—Ernest A. Greenside

[57] ABSTRACT

The invention concerns the use of a thyristor in a control circuit for electric power control. The thyristor is so connected and controlled that the number of complete half cycles during which the thyristor is conductive and non-conductive is varied, the thyristor being rendered conductive by a control pulse at its gate electrode immediately before or at the start of the half cycles during which the thyristor is to be conductive.

3 Claims, 1 Drawing Figure

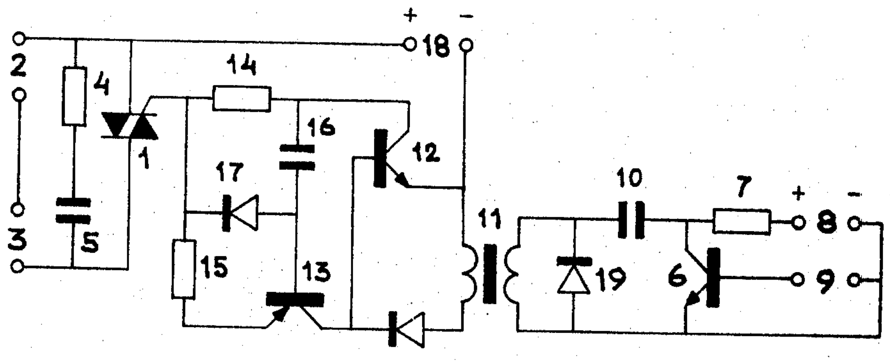
+
-
18
2
3
4
5
1
14
16
17
15
13
12
11
10
7
+
-
8
9
19
6

CONTROL CIRCUIT FOR POWER CONTROL BY MEANS OF A THYRISTOR

The application relates to a control circuit for power control with a thyristor, in which the thyristor is periodically rendered conducting by the application of a control pulse to its gate electrode.

As is known per se, thyristors are eminently suitable for power control with small losses, in which the thyristor is either fully conductive, or fully non-conductive, and in which the control is effected by variation of the ratio of the time intervals during which the thyristor is conductive and non-conductive respectively. The conventional thyristor can pass the current in only one direction, but a type has been developed, sometimes called triac, which can pass the current in both directions and which can be controlled in both directions. Both types are here taken together under the term thyristor.

The most usual way of control for power control is called phase control and consists therein, that some time after the passage through zero of the voltage at the start of the half cycles under consideration (alternate half cycles with a thyristor which can pass current in only one direction and all half cycles with a thyristor which can pass current in both directions), a control pulse is applied to the gate electrode of the thyristor, whereby this is rendered conductive and remains conductive until the first passage through zero of the current. By variation of the delay of the control pulse with respect to the passage through zero of the voltage, the fraction of each half cycle in which the thyristor is non-conductive can be varied, so that the ratio of the time intervals during which the thyristor is non-conductive and conductive respectively can be varied in this way. However, there is an increasing tendency of the electrical power distribution enterprises, to prohibit this way of control, as it causes an unfavourable load of the power system.

The application aims at providing a more acceptable solution to the cited problem.

Accordingly, a device according to the application is characterized in that the control circuit is so designed, that during at least one half cycle of the voltage to which the thyristor is connected, it delivers a control pulse starting shortly before or at each passage through zero of the voltage and terminating at least one tenth of a cycle later, and subsequently delivers no control pulse during at least one half cycle, the number of successive half cycles in which control pulses are delivered and/or the number of successive half cycles in which no control pulses are delivered, being adjustable for controlling the relative number of half cycles in which the thyristor is rendered conductive.

With this control, no variation of the conduction interval within a half cycle occurs, against which objections could exist on the part of the distribution enterprises for electrical power, but rather the number of complete half cycles during which the thyristor is conductive and is not conductive respectively is varied, against which no objection can be made.

Immediately before or at the start of the half cycles in which the thyristor should be conductive, this is rendered conductive by a control pulse at its gate electrode and in that connection it is not of importance how heavy the load is, as the control pulse keeps the thyristor conductive, even if the load current is initially so small that it is not capable of keeping the thyristor conductive by itself. This is of special importance for light loads and heavily inductive loads, in which the current lags on the voltage, so that no reliable control can be obtained by means of a spike pulse, since due to the small value or the lag of the current, the load current at the end of such a spike pulse can easily be insufficient for keeping the thyristor conductive. With a long control pulse according to the application, the load current, even with a light load and/or strongly inductive load is amply given the opportunity to increase to a value which is sufficient for keeping the thyristor conductive before the control pulse terminates, so that the passage of current until the next passage through zero of the current is guaranteed under all circumstances.

The invention will be elucidated below with reference to the drawing, which shows a circuit diagram of a device according to the invention.

The thyristor 1 in the drawing, in this case shown as a triac, is through terminals 2 connected to the AC mains and is through the terminals 3 connected to the load to be supplied therefrom. The resistor 4 and the capacitor 5 serve in a way known per se for protecting the thyristor 1 against voltage surges. The transistor 6 is through a resistor 7 connected to an input 8 at which a DC voltage is supplied during those half cycles in which the thyristor 1 should be rendered conductive. The base of the transistor 6 is connected to an input 9 to which the double wave rectified, but unsmoothed supply voltage is applied with such polarity that it renders the transistor 6 when the DC voltage is supplied to input 8. The capacitor 10 is thereby charged through the pulse transformer 11 shortly before the start of each half cycle, the transistor 12 being rendered conductive simultaneously. As soon as the transistor 6 again becomes conductive, the capacitor 10 is discharged through the diode 19. The transistor 12 with the transistor 13, the resistors 14 and 15, the capacitor 16 and the diode 17 forms a monostable circuit which is supplied from the connection 18 with a DC voltage and which delivers, when in its unstable condition, to the gate electrode of the thyristor, a control pulse beginning shortly before or at the passage through zero of the unsmoothed rectified supply voltage and terminates approximately three-eighths of a cycle thereafter. The length of this pulse duration is amply sufficient for ensuring that, even with a small load and a strongly inductive load, the current through the thyristor at the end of the pulse has increased sufficiently for keeping the thyristor conductive until the next passage through zero.

What we claim is:

1. A control circuit for controlling current flow from an alternating current source through a load and comprising thyristor means connected in series between the source and the load and having a gate electrode, and means for selectively producing a control pulse for application to said gate electrode, said last-named means including a transformer having coupled primary and secondary circuits, said secondary circuit having components forming a monostable circuit the output of which, comprising said control pulse, is connected to said gate circuit, a first DC voltage source being provided and supplying a DC supply voltage to said monostable circuit, said primary circuit having electrical components producing current flow in said primary circuit under control of said alternating current source, and a second DC voltage source for supplying a DC voltage to said primary circuit for rendering it operative during predetermined one-half cycles of said alternating current source.

2. A circuit according to claim 1, wherein the first DC voltage source is connected between the thyristor means and the transformer secondary winding and the second DC voltage source has one terminal electrically connected to the collector of a transistor included in said primary circuit, the base of said transistor being connected to one terminal of a rectified voltage derived from said alternating current source, the emitter of said transistor being connected to the other terminal of said second DC voltage source and said rectified voltage.

3. A circuit according to claim 2, characterized in that the collector and emitter electrodes of said transistor are connected in shunt relationship with said primary winding through the intermediary of a condenser.

* * * * *